United States Patent [19]
Ha

[11] Patent Number: 6,021,067
[45] Date of Patent: Feb. 1, 2000

[54] CIRCUIT OF SENSING A FUSE CELL IN A FLASH MEMORY

[75] Inventor: Chang Wan Ha, Kyungki-Do, Rep. of Korea

[73] Assignee: Hyundai Electronics Industries Co., Ltd., Kyungki-Do, Rep. of Korea

[21] Appl. No.: 09/210,172

[22] Filed: Dec. 11, 1998

[30] Foreign Application Priority Data

Dec. 23, 1997 [KR] Rep. of Korea ...................... 97-72741

[51] Int. Cl.[7] .................................................. G11C 16/06
[52] U.S. Cl. .............................. 365/185.21; 365/225.7; 365/185.33
[58] Field of Search ........................... 365/185.21, 225.7, 365/185.33

[56] References Cited

U.S. PATENT DOCUMENTS

| | | | |
|---|---|---|---|
| 5,200,922 | 4/1993 | Rao | 365/225.7 |
| 5,327,384 | 7/1994 | Ninomiya | 365/218 |
| 5,677,882 | 10/1997 | Isa et al. | 365/200 |

*Primary Examiner*—David Nelms
*Assistant Examiner*—Tuan T. Nguyen
*Attorney, Agent, or Firm*—Cohen, Pontani, Lieberman & Pavane

[57] ABSTRACT

This invention discloses a circuit of sensing a fuse cell used for repairing a failed memory cell, the circuit comprising a power-on reset circuit to generate reset pulses at the time of power-on of the flash memory, a reference circuit to latch an initial state according to output signal of the power-on reset circuit, a voltage divider circuit to output the voltage for sensing a fuse cell in said reference circuit according to output signal of the reference circuit, and a main memory cell data latch circuit to latch information on the fuse cell according to output signals of the power-on reset circuit and the reference circuit.

9 Claims, 5 Drawing Sheets

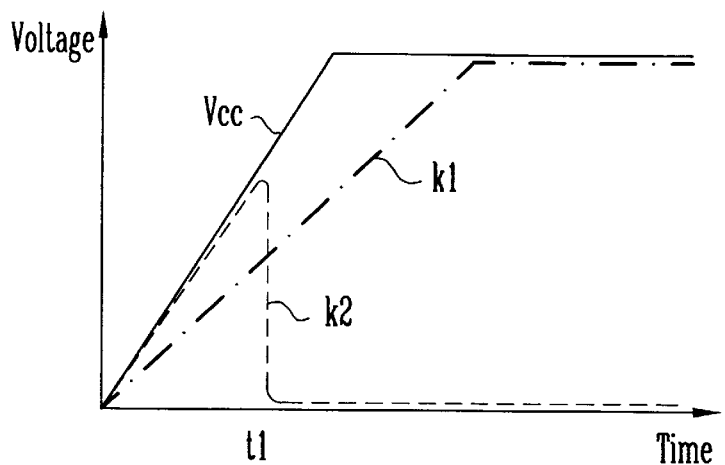
FIG. 2B
FIG. 3A
(PRIOR ART)
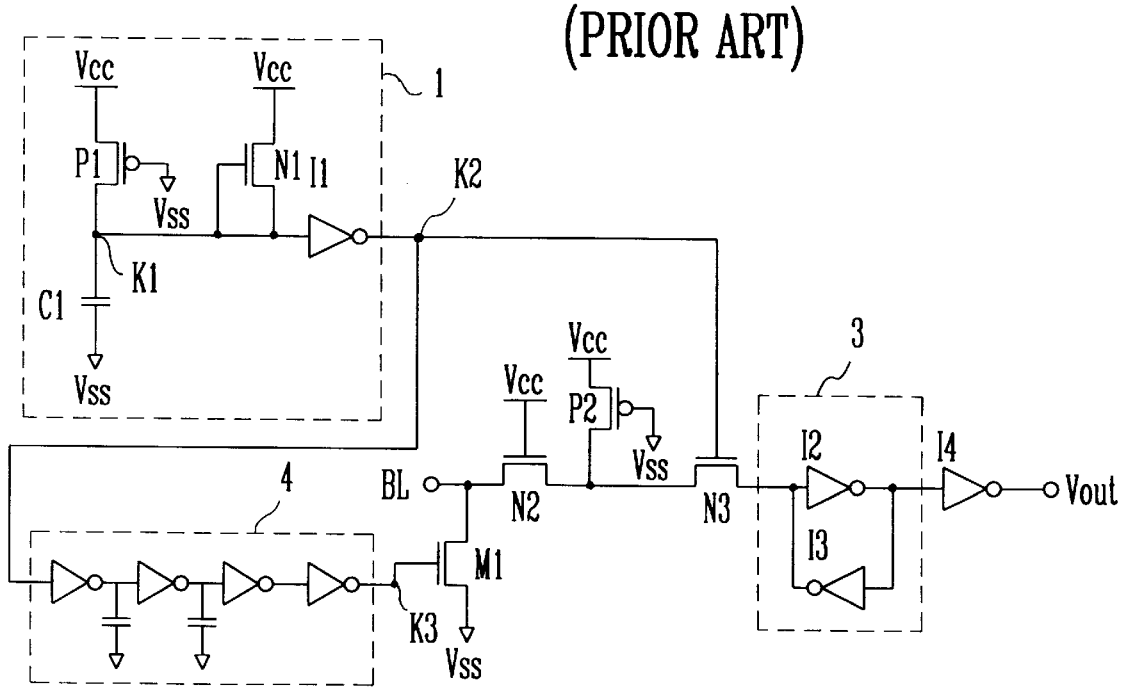

CIRCUIT OF SENSING A FUSE CELL IN A FLASH MEMORY

BACKGROUND OF THE INVENTION

1. Field of the Invention

The present invention relates to a circuit of sensing a fuse cell in a flash memory, and more particularly to a circuit of sensing a fuse cell in a flash memory which can latch stably a data stored on a fuse cell(Content Address Memory-CAM) at the time of power-on of a flash memory, by deciding time setup for sensing and latching a data on the fuse cell by a reference circuit and by tracking the sensing time due to process change by the reference circuit, in reading and latching fuse cell data at the time of power-on of the memory.

2. Description of the Prior Art

Typically, technology for latching data on a fuse cell at the time of power-on of a flash memory is already known for VLSI design in the repair circuit of a flash memory.

FIG. 1 is a circuit diagram of sensing a fuse cell in a flash memory according to a prior art.

Operation of FIG. 1 will be described with reference to FIGS. 2A and 2B.

If supply voltage Vcc is power-up at zero(0) volt (t1 of FIG. 2A), the initial voltage level of the first node K1 becomes the virtual ground(threshold voltage of transistor N1) by an NMOS transistor N1 in the power-on reset circuit 1, and the capacitor C1 is not charged at the initial stage. However, during the supply voltage Vcc rises, the capacitor C1 is gradually charged by the current flowing through a PMOS transistor P1. As the PMOS transistor P1 is small and the capacitor C1 is very large, electric potential of the first node K1 keeps a low state because the potential rises more slowly than ramp up speed of the supply voltage until it becomes higher than a specified threshold voltage Vt of the inverter I1. The electric potential of the output node K2 in the power-on reset circuit 1, which is the output of the inverter I1, keeps the high state, and allows the NMOS transistor N3 turned on. The word line voltage is applied to the gate electrode of the fuse cell M1 by the word line decoder circuit 2 and the fuse cell M1 is selected.

For example, current flowing to the ground terminal Vss is cut off by the fuse cell M1 if the fuse cell M1 is programmed normally. Then, the NMOS transistor N2, of which a gate electrode is applied with the supply voltage Vcc, is turned on, and potential of the bit line BL becomes high state by the PMOS transistor P2. Voltage of the bit line is applied to the inverter I2 of the latch circuit 3 through the NMOS transistor N3, and output of the above inverter I2 is latched to be low. Output of the inverter I2 is inverted to be high by the inverter I4, and is output through the output terminal Vout(out 1 of FIG. 2A).

On the contrary, if the fuse cell M1 is at the erase state, current pass is made to the ground terminal Vss by the fuse cell M1. Though the NMOS transistor N2, of which a gate electrode is applied with the supply voltage Vcc, is turned on and potential of the bit line BL becomes high by the PMOS transistor P2, current pass is made to the ground terminal by the fuse cell M1 and the potential of the bit line BL becomes low. The bit line voltage is input to the inverter I2 of the latch circuit 3 through the NMOS transistor N3, and the output of the inverter I2 is latched to the high state. Then, the output of the latch circuit 3 is inverted to the low state through the inverter I4, and is output through the output terminal Vout (out 2 of FIG. 2A).

In addition, when the supply voltage Vcc is higher than a predetermined voltage and the first node k1 becomes the high state, the electric potential of the output node K2 in the power-on reset circuit 1, which is the output of the inverter I1, keeps the low state and the NMOS transistor N3 is turned off. Thus, the fuse cell M1 and the latch circuit 3 are separated from each other.

Namely, as shown in FIG. 2B, if the time(t1) that the voltage is higher than a predetermined threshold voltage Vt of the inverter I1 passes, the electrical potential of the first node K1 becomes a high state, and the electrical potential of the output node K2 in the power-on reset circuit 1, which is the output of the inverter I1, becomes a low state.

However, as word line voltage is applied continuously to the gate electrode of the fuse cell M1 by the word line decoder circuit 2, it causes gate stress of the fuse cell M1. Thus, there is a problem in that charge capacity of the fuse cell M1 is lost because of the above reason.

It is necessary to minimize gate stress of a fuse cell by making the gate voltage needed for a sensing fuse cell sensing down to 0 V at the time of power-on(or after power-on).

FIG. 3A is a circuit diagram to solve the above problem. Its operation may be described with reference to FIG. 3B.

The voltage of an node K2, the output of the power-on reset circuit 1, is applied to the delay circuit 4. Word line voltage, the output voltage of the delay circuit 4, is applied to the gate electrode of the fuse cell M1. When voltage of the node K2, the output of the power-on reset circuit 1, becomes a low state, the word line voltage applied to the gate electrode of the fuse cell M1 is delayed for a predetermined time by the delay circuit 4 and then blocked(t1 to t2 in FIG. 3B).

However, such technology is the method to execute sensing of a fuse cell M1 for a predetermined time, using the power-on reset signals generated in the power-on reset circuit 1 at the time of power-on of a device. The time for sensing and latching a fuse cell M1 is fixed to a specified value by device designer at the time of design. Sometimes the case occurs that it is impossible to sense a fuse cell within the specified time designated in designing due to the cell current of a flash EEPROM cell for process change, and changes in threshold voltage and transistor characteristics.

Namely, if the word line voltage applied to the gate electrode of the fuse cell becomes the voltage not enough for sensing the memory state, the latch circuit 3 can not execute latching the data in the fuse cell M1.

Although the capacity of the PMOS transistor P2 and the ratio of the memory cell current(Ids) depending on the word line voltage applied to the gate electrode of the fuse cell M1 is suitable for sensing, it is impossible to latch the data of a memory cell to the latch circuit 3 even though the gate voltage of the fuse cell M1 is high, if the memory cell Vt and the turn-on current changes by process, as the size of the PMOS transistor P2, the threshold voltage of the inverter I1 and delay time by the delay circuit 4 is already defined at the time of designing a memory cell.

SUMMARY OF THE INVENTION

Accordingly, it is an object of the present invention to provide a circuit of sensing a fuse cell in a flash memory which can latch stably a data stored on a fuse cell(Content Address Memory-CAM) at the time of power-on of the flash memory, by deciding time setup for sensing and latching a data on a fuse cell by a reference circuit and by tracking the sensing time due to process change by the reference circuit, in reading and latching fuse cell data at the time of power-on of the memory.

To achieve the above object, a circuit of sensing a fuse cell in a flash memory, according to the present invention comprising:

a power-on reset circuit to generate reset pulses at the time of power-on of the flash memory;

a reference circuit to latch an initial state according to output signal of the power-on reset circuit;

a voltage divider circuit to output the voltage for sensing a fuse cell in the reference circuit according to output signal of the reference circuit; and a main memory cell data latch circuit to latch information on the fuse cell according to output signals of the power-on reset circuit and the reference circuit.

It is to be understood that both the foregoing general description and the following detailed description are exemplary and explanatory and are intended to provide further explanation of the invention as claimed.

BRIEF DESCRIPTION OF THE DRAWINGS

The above object, and other features and advantages of the present invention will become more apparent by describing the preferred embodiment thereof with reference to the accompanying drawings, in which:

FIGS. 2A and 2B illustrate voltage of each node of FIG. 1;

FIG. 3A is a circuit diagram of sensing a fuse cell in a flash memory according to the prior art;

Similar reference characters refer to similar parts in the several views of the drawings.

DETAILED DESCRIPTION OF THE PREFERRED EMBODIMENTS

Reference will now be made in detail to the preferred embodiments of the present invention, and examples of which are illustrated in the accompanying drawings.

Figure 1:
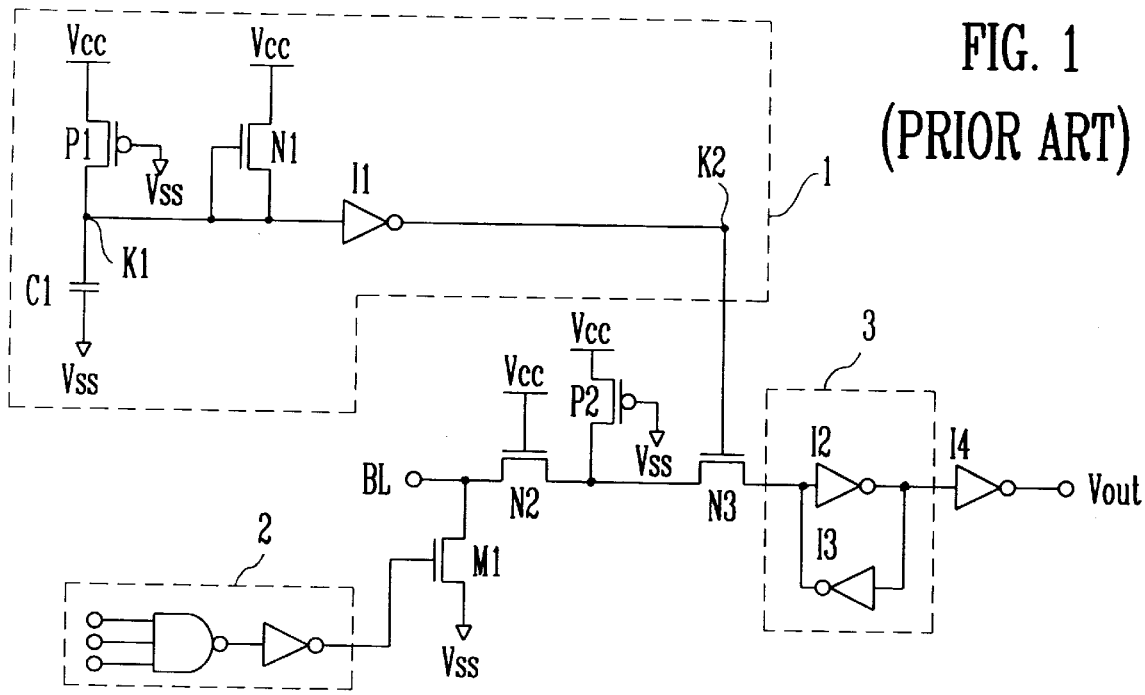
FIG. 1 is circuit diagram of sensing a fuse cell in a flash memory according to the prior art.
Figure 2A:
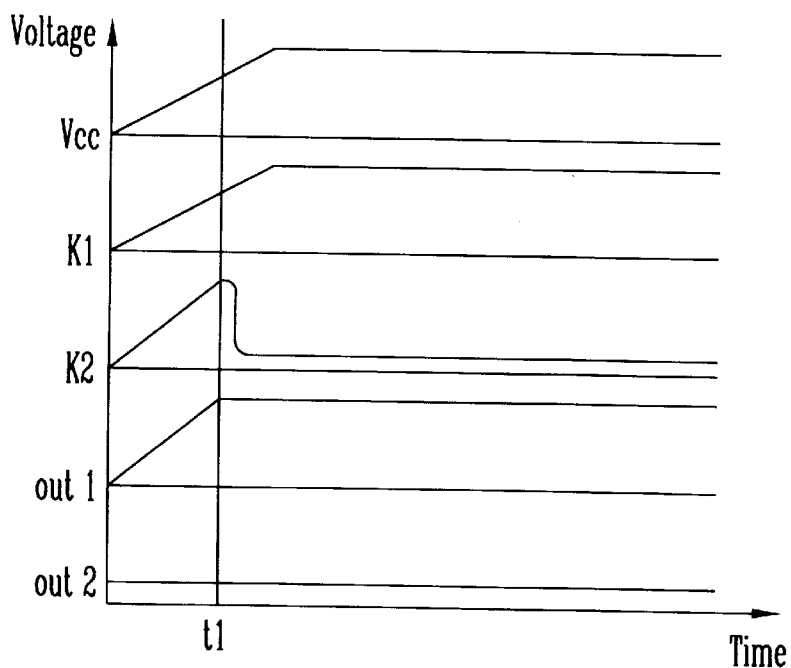
Figure 3B:
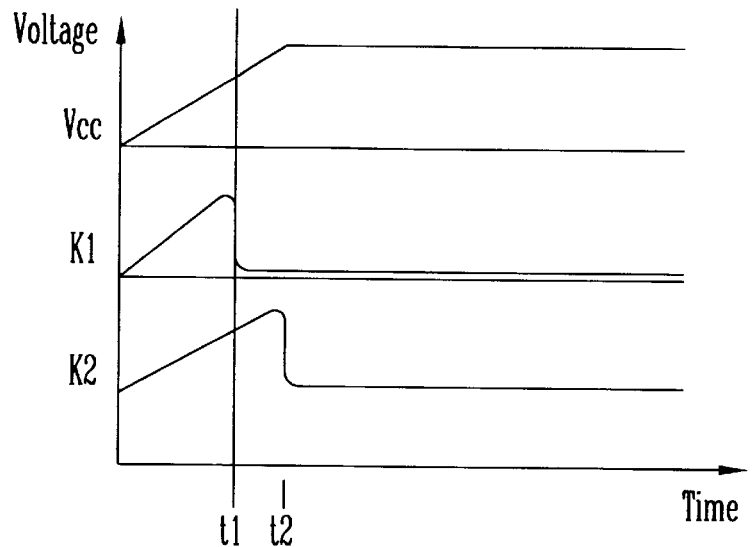
FIG. 3B illustrates voltage of each node of FIG. 3A.
Figure 4:
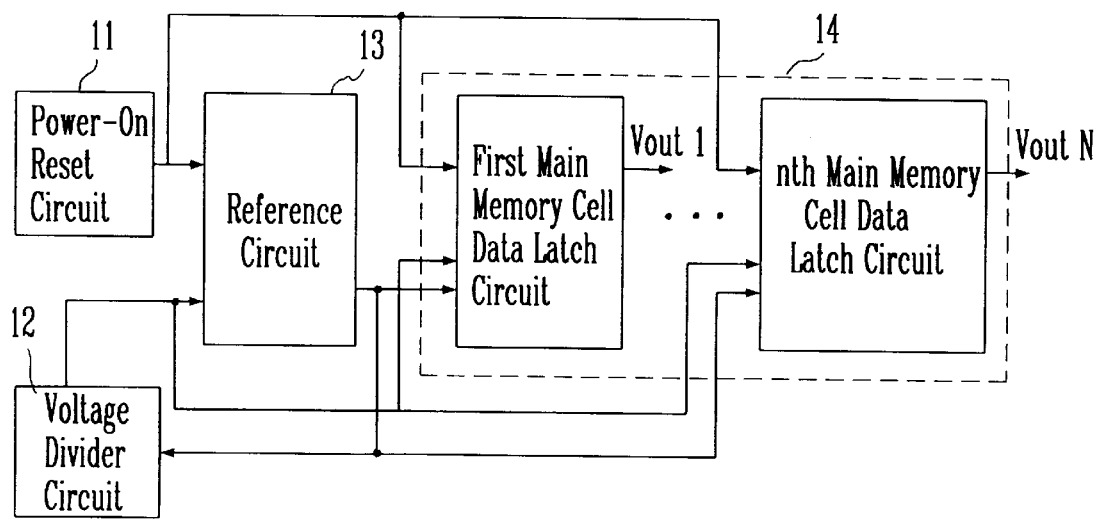
FIG. 4 is block diagram of a circuit of sensing a fuse cell in a flash memory in accordance with the present invention.

FIG. 4 is a block diagram of a circuit of sensing a fuse cell in a flash memory in accordance with the present invention, which comprises a power-on reset circuit 11, a voltage divider circuit 12, a reference circuit 13 and a main memory cell data latch circuit 14 with the automatic sensing time tracking function.

The main memory cell data latch circuit 14 comprises the first through the n-th main memory cell data latch circuits.

The above power-on reset circuit 11 generates one reset pulse at the time of power-on of supply voltage. The reference circuit 13 outputs control voltage to control the voltage divider circuit 12 and the main memory cell data latch circuit 14 by the reset pulse which is output from the power-on reset circuit 11. The voltage divider circuit 12 outputs the control voltage for sensing the reference circuit 13 and the main memory cell data latch circuit 14 according to the control voltage which is output from the reference circuit 13. The main memory cell data latch circuit 14 outputs its own fuse cell(not shown in FIG. 4) information through the output terminals(Vout1 to VoutN) after latching the information to the first through the n-th main memory cell data latch circuits according to the control voltage which is output from the reference circuit 13 and the voltage divider circuit 12.

Figure 5:
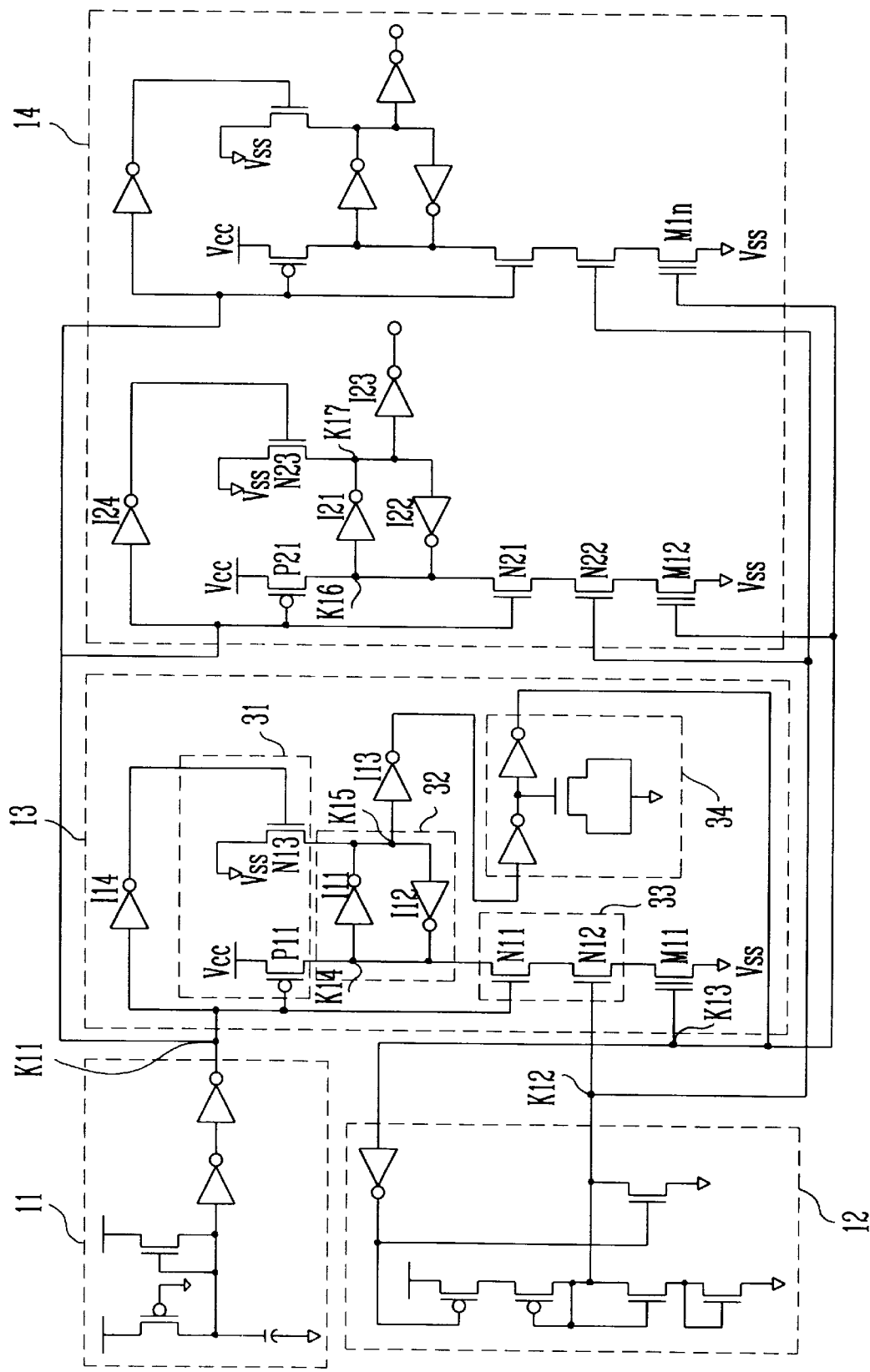
FIG. 5 is a detailed circuit diagram of FIG. 4.

For instance, for repairing flash memory in 1 byte, eight (8) reference circuits 13 are connected in parallel from each other and eight main memory cell data latch circuit 14 are connected in parallel from each other because addresses corresponding to 1 byte are eight FIG. 5 is a detailed circuit diagram of a circuit of sensing a fuse cell in a flash memory in accordance with the present invention, whose operation may be described with reference to FIG. 6.

At the time of power-on of a memory (t1 in FIG. 6), the output signal, which is a low state generated in the power-on reset circuit 11, is applied to a first node K11. The voltage of the first node K11 is applied to the reference circuit 13. Thus, a PMOS transistor P11 of an initializing circuit 31 is turned on, while an NMOS transistor N11 of a sensing circuit 33 is turned off. Therefore, supply voltage from the power terminal Vcc is applied, through the PMOS transistor P11, to the fourth node K14 of the latch circuit 32, and the fourth node K14 becomes a high state, while the fifth node K15 becomes a low state by an inverter I11.

The fourth node K14 is latched to the high state by the inverter I12.

The third node K13, to which the voltage of the fifth node K15 is applied through an inverter I13 and the delay circuit 34, becomes a high state after delaying a predetermined time.

Then, the voltage divider circuit 12 is enabled depending on the voltage of the third node K13. Also, the voltage of the third node K13 is applied to the fuse cell M11 of the reference circuit 13 and each fuse cell M12 through M1n of the main memory cell data latch circuit 14. The fuse cell M11 has been erased enough.

Hereinafter, the electric potential of the first node K11 becomes a high state for t2 time in FIG. 6 and the PMOS transistor P11 of the initializing circuit 31 is turned off, while the NMOS transistor N11 of the sensing circuit 33 is turned on. Also, the NMOS transistor N13 of the initializing circuit 31, to which the voltage of the first node K11 is input through inverter I14, is turned off. Then, the NMOS transistor N12 of the sensing circuit 33 is turned on. Thus, current pass is formed from the fourth node K14 to the ground terminal Vss through the fuse cell M11 of the reference circuit 13. The voltage of the fourth node K14 is decided depending on the current flowing through the fuse cell M11. The voltage of the fifth node K15 keeps a low state during the period when the fifth node K14 keeps a high state. Also, the voltage of the third node K13, to which the voltage of the fifth node K15 is applied through the inverter I13 and the delay circuit 34, keeps a high state and the voltage of the second node K12 keeps a high state.

Then, the main memory cell data latch circuit 14, to which the voltage of the first node K11 and the voltage of the third and second nodes K13 and K12 are input, reads and latches information on fuse cells M12 through M1n.

Figure 6:
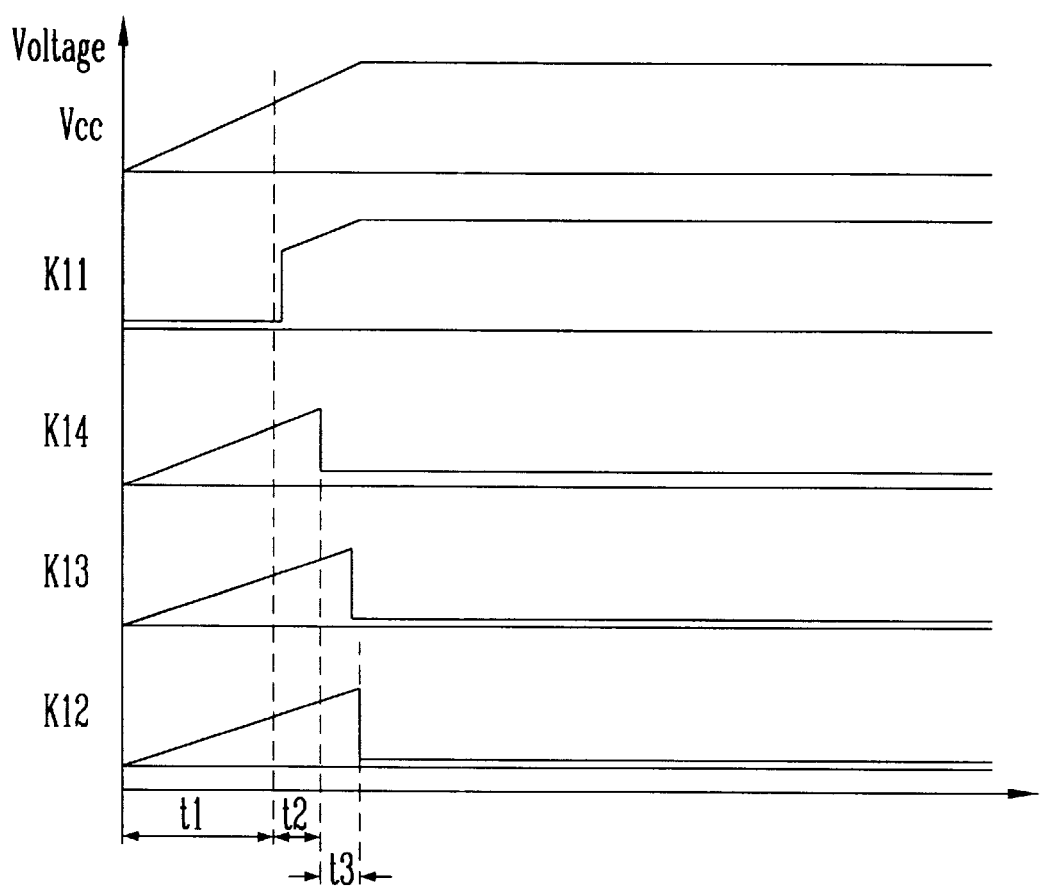
FIG. 6 illustrates voltage of each node of FIG. 5.

The electric potential of the first node K11 keeps a high state for t3 time(when supply voltage rises normally) of FIG. 6, and the PMOS transistor P11 and the NMOS transistor N13 of the initializing circuit 31 are turned off, while the NMOS transistor N11 of the sensing circuit 33 is turned on. Also, the NMOS transistor N12 of the sensing circuit 33, to which the output of the voltage divider circuit 12, is turned. Then, as current pass is formed from the fourth node K14 to the ground terminal Vss through the fuse cell M11, the voltage of the fourth node K14 changes from a high state to a low state. To the contrast, the voltage of the fifth node K15 changes from a low state to a high state.

Also, the voltage of the third node K13 changes from a high state to a low state, while the voltage of the second node K12 changes into a low state. Thus, voltage to be provided to the fuse cell M11 of the reference circuit 13 and the fuse cells M12 through M1n of the main memory cell data latch circuit 14 is blocked during the period of t3 in FIG. 6 when the above supply voltage rises enough.

Namely, during the period of t1 in FIG. 6, as the voltage of the first node K11 which is the output of the power-on reset circuit 11 becomes a low state, the fourth node K14 is initialized into a high state fifth node K15 is initialized into a low state. Then, the NMOS transistor N11 is turned off. The PMOS transistor P11 and the NMOS transistor N13 are turned off after t1 in FIG. 6, and the voltage of the third node K13 keeps a high state during the fourth node K14 keeps a high state which is the initial state. And the second node K12 keeps a high state by voltage which is output from the voltage divider circuit 12. Then, the main memory cell data latch circuit 14 reads and latches the information of its own fuse cells M12 to M1n. The voltage provided to the fuse cells M11 to M1n is blocked if the supply voltage rises enough and becomes stable voltage.

The reference circuit 13 is used for deciding a reference time, and the main memory cell data latch circuit 14 is a circuit for latching memory cell information. The sensing time of the main memory cell data latch circuit 14 is decided by the state of a memory cell M11.

Namely, if the fuse cell M12 is a programmed cell (threshold voltage of the cell is about 4 V to 5 V), the sensing time of the main memory cell data latch circuit 14 is zero(0) ns. Because the current(Ids) of the NVM cell M12 is zero(0) $\mu$A if the fuse cell M12 is a programmed cell, the electric potential of the sixth node K16 keeps a high state and the electric potential of the seventh node K17 keeps a low state. But, as the electric potential of the sixth node K16 is already keeping a high state for t1 in FIG. 6, time for keeping the electric potential of the sixth node K16 at a high state is not needed.

To the contrast, if the fuse cell M12 is an erased cell (threshold voltage of the cell is about 0.5 V to 1.5 V) or an ultraviolet-rayed cell(threshold voltage of the cell is about 1.0 V to 2.0 V), the electric potential of the sixth node K16 initialized into the high state for t1 in FIG. 6 turns into a low state by the current(Ids) flowing into the fuse cell M12 since the NMOS transistors N21, N22 are turned on. The sensing time is decided depending on the ratio of the current(Ids) flowing into the fuse cell M12 and the current(Ids) flowing to the PMOS transistor(not shown) of the inverter I22. As the result, the sensing time of an erased cell changes depending on the ratio of the current(Ids) flowing into the PMOS transistor of the inverter I22 and into the fuse cell M12 by process change. It is difficult to guess exactly the time to make the gate voltage of the fuse cell M12 down to zero(0)V to reduce gate stress of the fuse cell M12.

The reference circuit with the automatic sensing time tracking function is used in the present invention to solve the above problem. The fuse cell M11 of the reference circuit 13 is the same with the fuse cell M12 of the main memory cell data latch circuit 14, but erased(ultraviolet-rayed) cells are used.

Also, the reference circuit 13 have the same structure with the main memory cell data latch circuit 14 excepting for the delay circuit 34.

Namely, the reference circuit 13 continusely sense the fuse cells M11, M12, by keeping the third node K13 a high state and the second node K12 with the output voltage of the voltage divider circuit 12, before the fourth node K14 becomes a low state and the fifth node K15 a high state after initializing the fourth node K14 as the high state and the fifth node K15 as the low state for t1 in FIG. 6.

For instance, if the fuse cell M12 is an erased cell, the time that the electrical potential of the sixth node K16 in the main memory cell data latch circuit 14 changes from the low state to a high state is the same with the time that the electrical potential of the fifth node K15 changes from the high state to a low state. Thus, after the electric potential of the fifth node K15 changes from the low state into a high state, the electric potential of the fifth node K15 in the reference circuit 13 is latched to the high state though the fuse cells M11 and M12 are turned off after a predetermined delaying time by the delay circuit 34. The electric potential of the sixth node K16 in the main memory cell data latch circuit 14 is latched to the low state if the fuse cell M12 is an erased cell while to the high state if the cell M12 is a programmed cell.

As described above, the circuit of sensing a fuse cell in a flash memory in accordance with the present invention gives an excellent effect that productivity and quality may improve in device production, by turning off the memory cells after sensing and latching memory cells without respect to changes in threshold voltage of memory cells due to process change.

While the present invention has been described and illustrated herein with reference to the preferred embodiment thereof, it will be understood by those skilled in the art that various changes in form and details may be made therein without departing from the spirit and scope of the invention.

What is claimed is:

1. A circuit of sensing a fuse cell in a flash memory, comprising:
    a power-on resist circuit to generate a reset pulse at the time of power-on of the flash memory;
    a reference circuit to latch an initial state according to an output signal of said power-on reset circuit, said reference circuit comprising said fuse cell;
    a voltage divider circuit to output the voltage for sensing said fuse cell in said reference circuit according to an output signal of said reference circuit; and
    a main memory cell data latch circuit to latch information on said fuse cell according to said output signals of said power-on reset circuit and said reference circuit.

2. The circuit of claim 1, wherein said reference circuit comprises:
    an initializing circuit to initialize said latch circuit according to said output signal of said power-on reset circuit; and
    a delay circuit to delay an output or said latch circuit and to control said fuse cell and said voltage divider circuit.

3. The circuit of claim 2, wherein said sensing circuit comprises:
    a pair of NMOS transistors connected between said latch circuit and said fuse cell in series and to which output of said power-on reset circuit and said voltage divider circuit are input.

4. The circuit of claim 2, wherein said latch circuit comprises a pair of inverters connected between said initializing circuit and said sensing circuit.

5. The circuit of claim 2, wherein said initializing circuit comprises;

a PMOS transistor which is connected between said latch circuit and a power terminal and to which an output of said power-on reset circuit is input; and a NMOS transistor which is connected between said latch circuit and a grounded terminal and to which an output of said power-on reset circuit is input through an inverter.

6. A circuit of sensing a fuse cell in a flash memory, comprising:

a power-on resist circuit to generate a reset pulse at the time of power-on of the flash memory;

a reference circuit to latch an initial state according to an output signal of said power-on reset circuit, said reference circuit comprising said fuse cell, a sensing circuit to sense data on said fuse cell, a latch circuit to latch data of said fuse cell which are sensed by said sensing circuit, an initializing circuit to initialize said latch circuit according to said output signal of said power-on reset circuit and a delay circuit to delay an output of said latch circuit and to control said fuse cell and said voltage divider circuit;

a voltage divider circuit to output the voltage for sensing a fuse cell in said reference circuit according to an output signal of said reference circuit; and a main memory cell data latch circuit to latch information on said fuse cell according to said output signals of said power-on reset circuit and said reference circuit.

7. The circuit of claim 6, wherein said sensing circuit comprises:

a pair of NMOS transistors connected between said latch circuit and said fuse cell in series and to which output of said power-on reset circuit and said voltage divider circuit are input.

8. The circuit of claim 6, wherein said latch circuit comprises a pair of inverters connected between said initializing circuit and said sensing circuit.

9. The circuit of claim 6, wherein said initializing circuit comprises:

a PMOS transistor which is connected between said latch circuit and a power terminal and to which output of said power-on reset circuit is input; and an NMOS transistor which is connected between said latch circuit and a grounded terminal and to which output of said power-on reset circuit is input through an inverter.

* * * * *